US008006636B2

(12) United States Patent
Terada et al.

(10) Patent No.: US 8,006,636 B2
(45) Date of Patent: Aug. 30, 2011

(54) SUBSTRATE TREATMENT APPARATUS

(75) Inventors: Kazuo Terada, Koshi (JP); Kazuo Sakamoto, Koshi (JP); Takeshi Uehara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 425 days.

(21) Appl. No.: 12/177,243

(22) Filed: Jul. 22, 2008

(65) Prior Publication Data

US 2009/0025637 A1     Jan. 29, 2009

(30) Foreign Application Priority Data

Jul. 25, 2007   (JP) .................... 2007-193049

(51) Int. Cl.
*B05C 11/02* (2006.01)
*B05B 15/04* (2006.01)
(52) U.S. Cl. .......... 118/326; 118/52; 118/612; 118/319; 118/320
(58) Field of Classification Search .................. 118/52, 118/612, 56, 319, 320, 500, 326, 61; 427/240; 134/153, 198, 902; 396/604, 611, 627; 454/50, 454/52; 55/DIG. 46; 161/80.3, 104.33; 361/697, 361/700
See application file for complete search history.

(56) References Cited

U.S. PATENT DOCUMENTS 5,211,753 A * 5/1993 Swain ............................ 118/52

FOREIGN PATENT DOCUMENTS

| JP | 02149367 A | * | 6/1990 |
| JP | 4-303919 | | 10/1992 |
| JP | 2000-153209 | | 6/2000 |

OTHER PUBLICATIONS

English Translated Abstract of JP-02149367A, Jun. 1990.*

* cited by examiner

*Primary Examiner* — Yewebdar T Tadesse
(74) *Attorney, Agent, or Firm* — Oblon, Spivak, McClelland, Maier & Neustadt, L.L.P.

(57) ABSTRACT

A substrate treatment apparatus of the present invention includes: a holding means for rotatably holding a substrate to be treated; a coating solution supply nozzle for supplying a coating solution onto the front surface of the substrate to be treated held on the holding means; a treatment container with an upper surface open for housing them; an exhaust means for exhausting an atmosphere in the treatment container from the bottom; a multiblade centrifugal fan provided on the inner periphery of the treatment container for flowing airflow on a front surface side of the substrate to the exhaust means; and a controller for controlling the number of rotations of the multiblade centrifugal fan corresponding to the number of rotations of the substrate, wherein the number of rotations of the multiblade centrifugal fan is controlled so that turbulent airflow flowing in a circumferential direction on the front surface of the substrate generated due to the rotation of the substrate is corrected to laminar airflow flowing in a radial direction.

7 Claims, 11 Drawing Sheets

SUBSTRATE TREATMENT APPARATUS

BACKGROUND OF THE INVENTION

1. Field of the Invention

The present invention relates to a substrate treatment apparatus for supplying a treatment solution to a substrate such as a semiconductor wafer, an LCD glass substrate and so on and treating it.

2. Description of the Related Art

Generally, in the photolithography technique in manufacturing process of a semiconductor device, a series of processes is performed such that a resist solution that is a coating solution is applied to the front surface of a substrate, such as a semiconductor wafer (hereinafter, referred to as a wafer), a resist film formed by the application of the solution is exposed to light according to a predetermined circuit pattern, and the exposed pattern is subjected to developing treatment to form a desired circuit pattern in the resist film.

In a resist coating unit and a developing treatment unit, a spinner system is employed in which a treatment solution such as a resist solution, a developing solution, or the like is supplied (discharged, dripped) to the wafer surface and the wafer is rotated, whereby a treatment solution film is formed on the wafer surface and treated. In this event, air is exhausted from the lower portion of a treatment container for housing the wafer.

However, a problem with, in particular, a large-sized wafer (for example, a wafer having a size larger than 300 mm) is that the treatment at an appropriate rotation cannot be performed and that exhaust of air cannot be uniformly performed due to an increase in size of the treatment container to cause mist occurring during treatment to attach to the wafer again.

In addition, in the resist coating, an appropriate rotation of the wafer increases the circumferential speed at the outer peripheral portion of the wafer accompanying the high speed ration, with the result that a region where the film thickness is disturbed to decrease the quality of the film appears at a boundary between a laminar flow region flowing in a radial direction of the wafer at a low speed rotation and a turbulent flow region flowing in the circumferential direction of the wafer at a high speed rotation. More specifically, Ekman spiral vortices occur in the flow in the circumferential direction in the boundary region between the laminar flow and the turbulent flow and disturb the film thickness to decrease the film quality.

Conventionally, an annular ring portion opened on the wafer side is provided on the inner periphery of the treatment container, and a multiblade centrifugal fan having many radial fins along a direction from the rotation direction of the wafer to the outer side is disposed on the annular ring portion to prevent reattachment of the mist to the wafer (see claims and FIG. 1 in Japanese Patent Application Laid-open No. H4-303919).

However, a problem in the above-described conventional technique is that treatment cannot be performed at an appropriate number of rotations of the wafer, failing to solve the decrease film quality due to the disturbance of the film thickness.

SUMMARY OF THE INVENTION

The present invention has been developed in consideration of the above circumstances, and its objects are to optimize treatment at an appropriate number of rotations of a substrate, to uniform the film thickness, to suppress a decrease in film quality, and to prevent reattachment of mist to the substrate in a substrate treatment apparatus.

The present invention is a substrate treatment apparatus including a holding means for rotatably holding a substrate to be treated; a rotation means for rotationally driving the holding means; a treatment solution supply nozzle for supplying a treatment solution onto the substrate to be treated held on the holding means; a treatment container with an upper surface open for housing the holding means; and an exhaust means for exhausting air from a bottom of the treatment container, further including:

a multiblade centrifugal fan provided on an inner periphery side of the treatment container for flowing airflow on a front surface side of the substrate to be treated to the exhaust means side; and a control means connected to the rotation means and a drive unit for the multiblade centrifugal fan for controlling a number of rotations of the multiblade centrifugal fan corresponding to a number of rotations of the substrate to be treated by the rotation means, wherein a control signal from the control means is transmitted to the multiblade centrifugal fan so that turbulent airflow flowing in a circumferential direction on the front surface of the substrate to be treated generated due to the rotation of the substrate to be treated is corrected to laminar airflow flowing in a radial direction.

According to the present invention, the number of rotations of the multiblade centrifugal fan is controlled corresponding to the number of rotations of the substrate to be treated, so that an appropriate amount of air can be exhausted according to the amount of airflow generated in the treatment container accompanying the rotation of the substrate to be treated, and the turbulent airflow flowing in the circumferential direction of the substrate to be treated generated during rotation of the substrate to be treated at a high speed can be corrected to laminar airflow flowing in a radial direction (in a direction of radius) of the substrate to be treated. Further, by exhausting the appropriate amount of air according to the amount of airflow generated in the treatment container accompanying the rotation of the substrate to be treated, mist can be efficiently collected.

The multiblade centrifugal fan may be disposed at a height position including a position of the front surface of the substrate to be treated held on the holding means.

Such an arrangement allows for efficient correction of the turbulent airflow occurring on the front surface of the substrate to be treated to the laminar airflow flowing in the radial direction of the substrate to be treated.

The multiblade centrifugal fan includes an annular electromagnetic coil disposed on the inner periphery side of the treatment container, a fan main body having many radial fins, an annular magnet attached to an outer periphery of the fan main body and facing an inner side of the annular electromagnetic coil, and a support body for rotatably supporting the fan main body on the inner periphery side of the treatment container via a thrust bearing, and the multiblade centrifugal fan may be mounted on a mounting portion provided protruding on an inner peripheral surface of the treatment container. Such an arrangement eliminates the necessity to separately provide a motor for the multiblade centrifugal fan.

In this case, the substrate treatment apparatus further includes a coil holder for holding the annular electromagnetic coil attached thereto, wherein the coil holder, the fan main body, the annular magnet, the thrust bearing, and the support body are individually attachable to and detachable from the treatment container.

DETAILED DESCRIPTION OF THE INVENTION

Hereinafter, preferred embodiments of the present invention will be described in detail with reference to the accompanying drawings. A case will be described here in which a substrate treatment apparatus according to the present invention is applied to a resist coating and developing treatment system for a semiconductor wafer.

Figure 1:
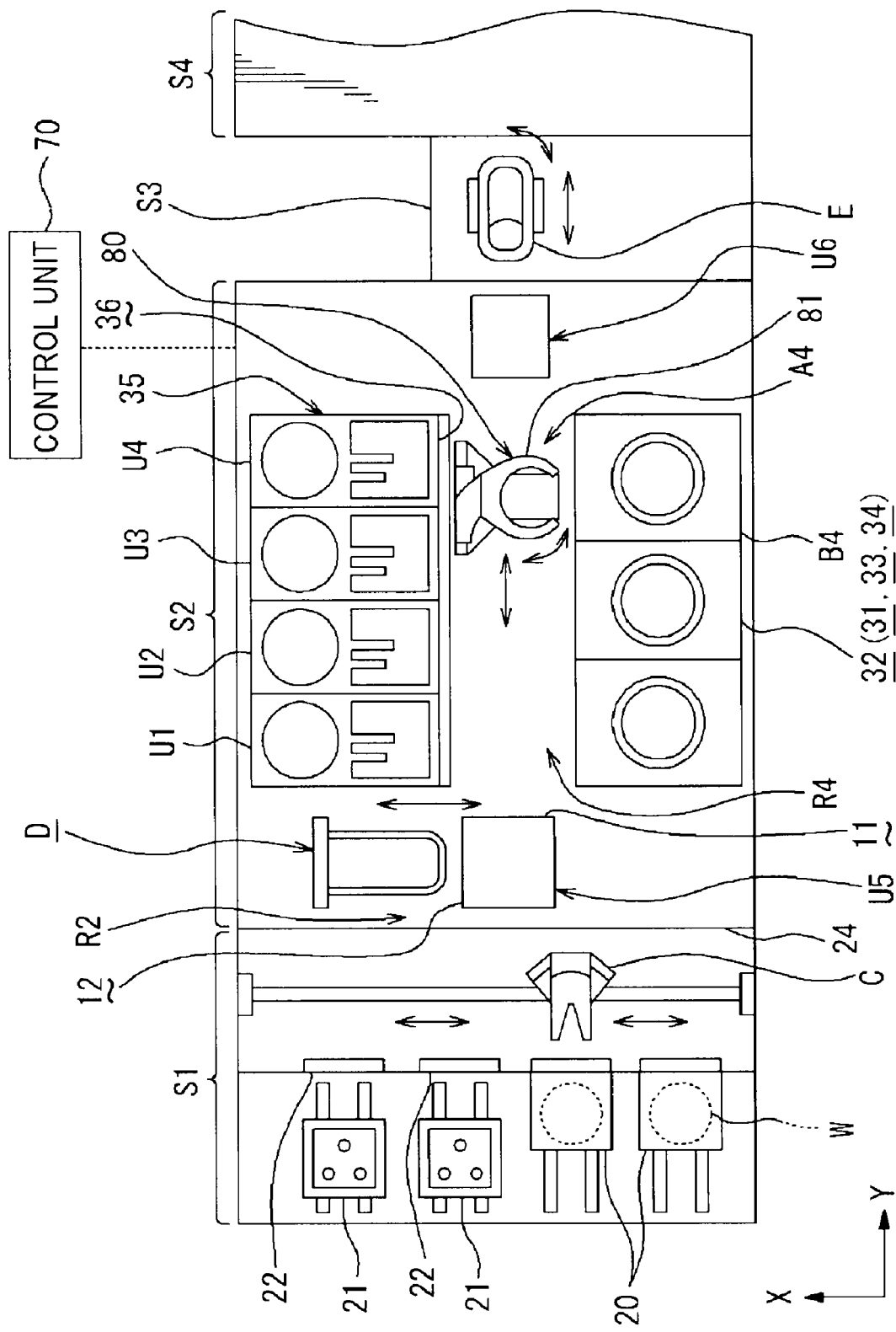
FIG. 1 is a plan view schematically showing an example of a resist coating and developing treatment system in which a substrate treatment apparatus according to the present invention is applied.
Figure 2:
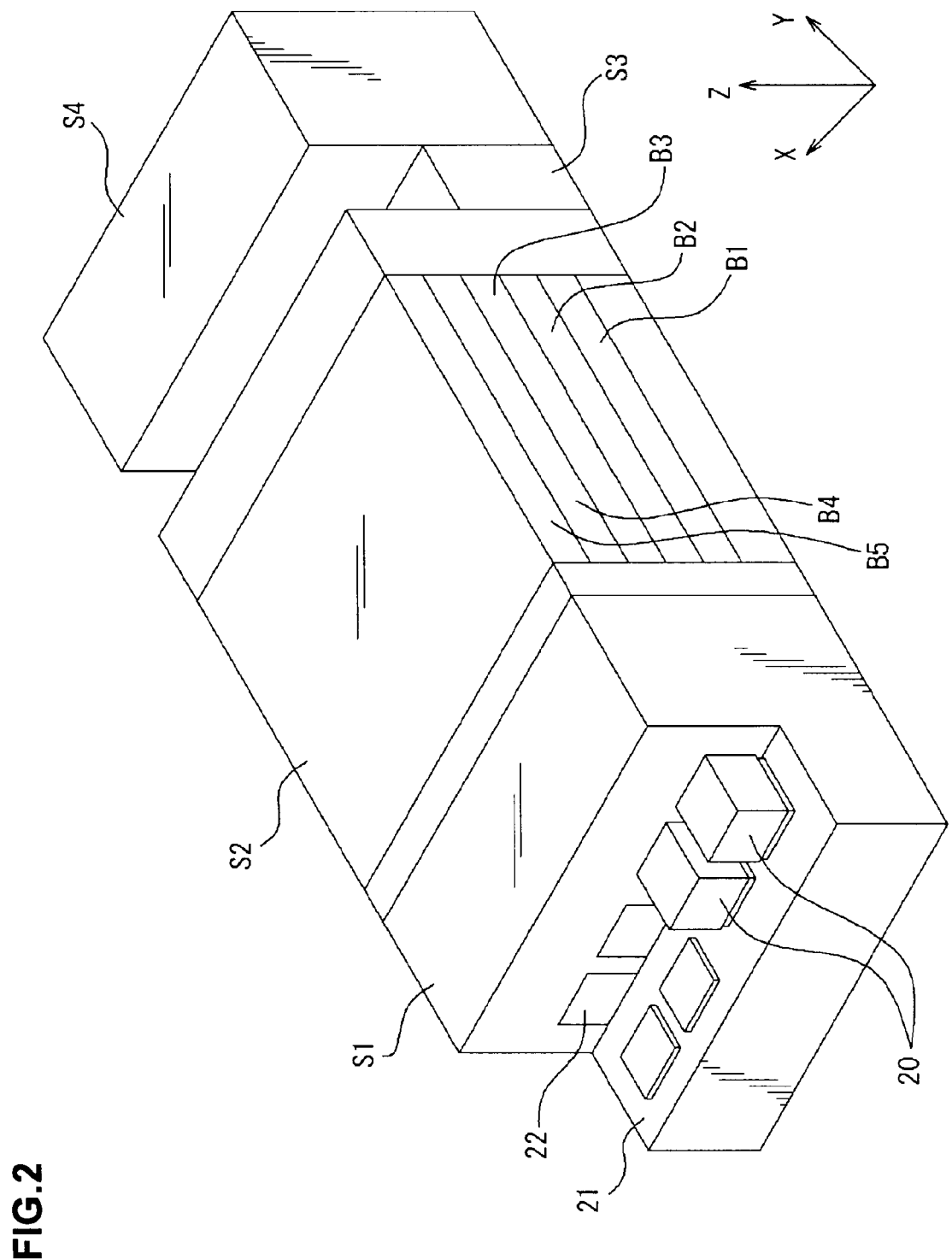
FIG. 2 is a perspective view of the resist coating and developing treatment system in FIG. 1.
Figure 3:
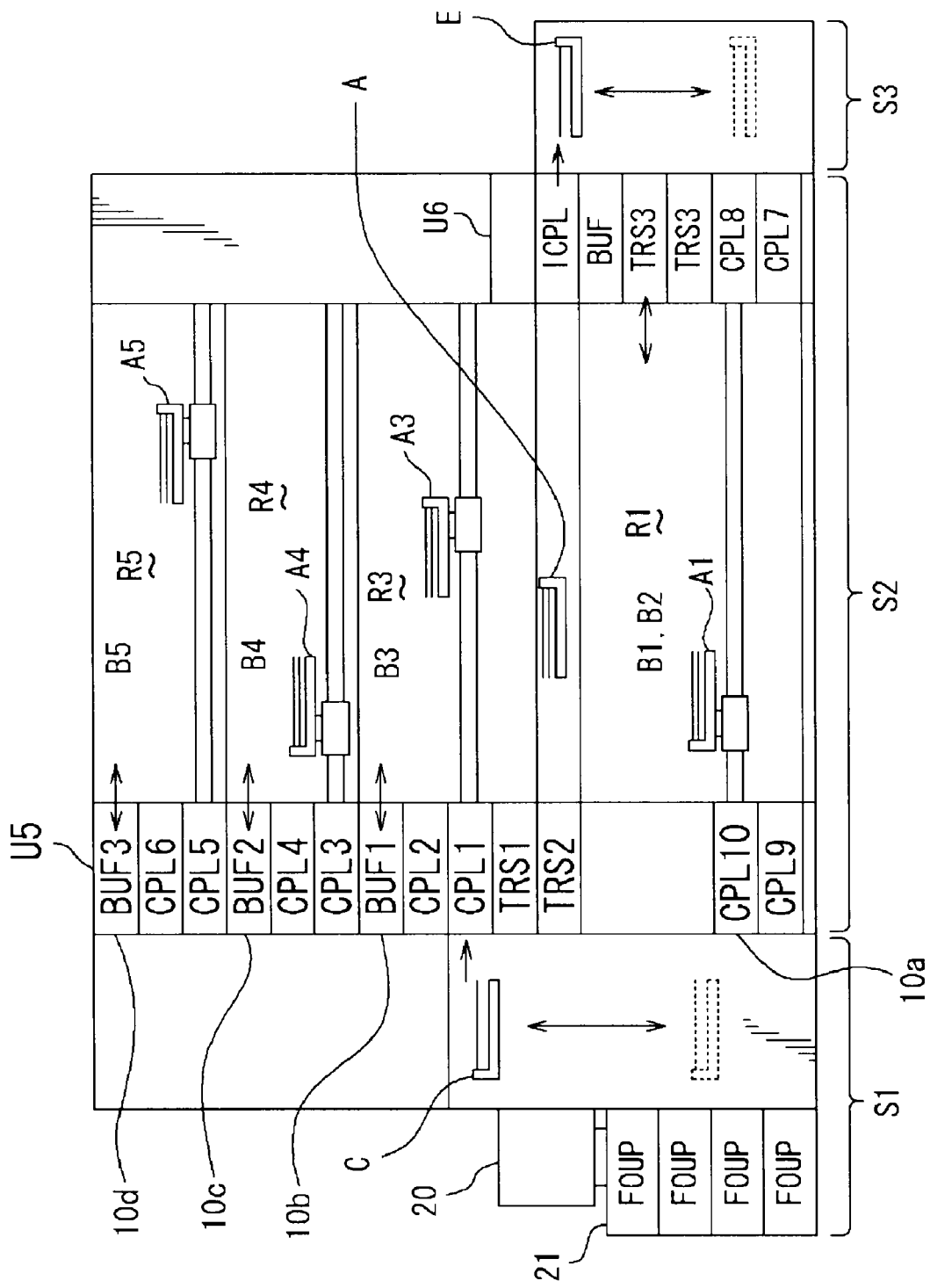
FIG. 3 is an explanatory view schematically showing a cross section of the resist coating and developing treatment system in FIG. 1.

FIG. 1 is a schematic plan view showing an example of the resist coating and developing treatment system, FIG. 2 is a schematic perspective view of the same, and FIG. 3 is a schematic sectional view of the same.

The resist coating and developing treatment system includes a carrier block S1 for transferring in/out a carrier 20 hermetically housing, for example, 13 semiconductor wafers W (hereinafter, referred to as wafers W) that are substrates to be treated; a processing block S2 composed of a plurality of, for example, five unit blocks B1 to B5 vertically arranged; and an interface block S3 for delivering the wafer W to/from an aligner S4.

In the carrier block S1, a plurality of (for example, four) mounting tables 21 capable of mounting carriers 20 thereon, opening/closing portions 22 provided on a front wall surface when seen from the mounting tables 21, and a transfer arm C for taking out the wafer W from the carrier 20 via the opening/closing portion 22, are provided. This transfer arm C is configured to be movable in horizontal X- and Y-directions and a vertical Z-direction and rotatable and movable around the vertical axis, so as to deliver the wafer W to/from delivery stages TRS1 and TRS2 provided in a later-described shelf unit U5 constituting a substrate housing section.

To the back side of the carrier block S1, the processing block S2 is connected which is surrounded at its periphery by a casing 24. The processing block S2 in this example has, from the bottom, the first and second unit blocks (DEV layers) B1 and B2 for performing developing treatment in two tiers on the lower tier side, the third unit block (BCT layer) B3 being a first anti-reflection film forming unit block for performing treatment of forming an anti-reflection film to be formed on the lower side of a resist film (hereinafter, referred to as a "first anti-reflection film"), the fourth unit block (COT layer) B4 being a coating film forming unit block for performing coating treatment of a resist solution, and the fifth unit block (TCT layer) B5 being a second anti-reflection film forming unit block for performing treatment of forming an anti-reflection film to be formed on the upper side of the resist film (hereinafter, referred to as a "second anti-reflection film"). The first and second unit blocks (DEV layers) B1 and B2 correspond to developing treatment unit blocks, and the third unit block (BCT layer) B3, the fourth unit block (COT layer) B4, and the fifth unit block (TCT layer) B5 correspond to coating film forming unit blocks.

Next, configurations of the first to fifth unit blocks B1 to B5 will be described. These unit blocks B1 to B5 include solution treatment units provided on the front side for applying chemicals to the wafer W; processing unit such as various heating units and the like provided on the rear side for performing pre-processing and post-processing of the treatment performed in the solution treatments; and main arms A1 and A3 to A5 which are dedicated substrate transfer means for delivering the wafer W between the solution treatment units arranged on the front side and the processing units such as the heating units and the like arranged on the rear side.

These unit blocks B1 to B5 are formed to have the same arrangement layout of the solution treatment units, the processing unit such as the heating units and the like, and the transfer means in this example. The same arrangement layout means that the center of the wafer W mounted in each treatment or processing unit, that is, the center of a spin chuck being a holding means for the wafer W in the solution treatment unit and the center of a heating plate and a cooling plate in the heating unit are the same.

The first and second unit blocks (DEV layers) B1 and B2 are similarly configured. In the first and second unit blocks (DEV layers) B1 and B2, a transfer region R1 for the wafer W for connecting the carrier block S1 and the interface block S3 is formed in the direction of the first and second unit blocks (DEV layers) B1 and B2 (the Y-direction in FIG. 2) at almost middle of the first and second unit blocks (DEV layers) B1 and B2 (see FIG. 3). The transfer region R1 is a horizontal moving region of the main arm A1.

Figure 4:
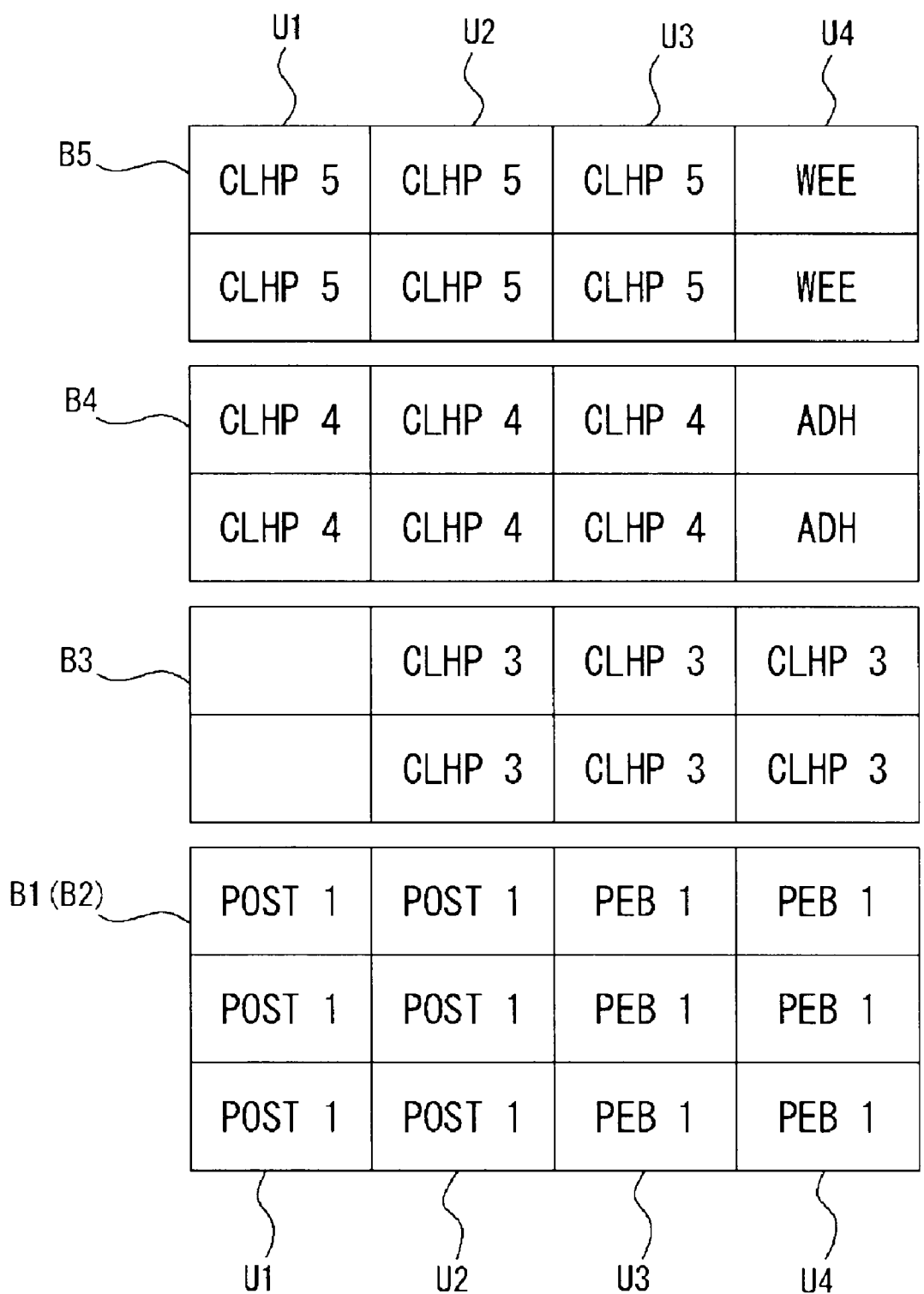
FIG. 4 is an explanatory view schematically showing a longitudinal section of an example of treatment and processing units in a processing block in the present invention.

On both sides of this transfer region R1 as seen from the carrier block S1 side, developing units 31 including a plurality of developing treatment sections for performing developing treatment are provided as the solution treatment units, for example, in two tiers on the right side from the near side (the carrier block S1 side) to the back side (the aligner 4 side). In each of the unit blocks, four shelf units U1, U2, U3, and U4 in each of which heating system units are multi-tiered are provided in order on the left side from the near side to the back side (on the left side from the carrier block S1 side to the aligner 4 side). In FIG. 4, various units for performing pre-processing and post-processing of the treatment performed in the developing unit 31 are stacked in a plurality of tiers, for example, three tiers. In this manner, the developing units 31 and the shelf units U1 to U4 are partitioned by the transfer region R1, and a cleaning air is jetted to the transfer region R1 and exhausted therefrom to suppress floating of particles in the region.

The aforementioned various units for performing pre-processing and post-processing include, for example, as shown in FIG. 4, heating units (PEB1) called post-exposure baking units for performing heating processing on the wafer W after exposure, heating units (POST1) called post-baking units for performing heating processing to extract water from the wafer W after developing treatment and so on. These processing units such as the heating units (PEB1 and POST1) are housed in the respective processing containers 35, and each of the shelf units U1 to U4 is composed of the processing containers are stacked in three tiers, and a wafer transfer in/out port 36 is formed in a surface of each of the processing containers facing the transfer region R1.

All of the coating film forming unit blocks B3 to B5 are basically similarly formed and formed similarly to the above-described developing treatment unit blocks B1 and B2. Specifically, explaining the unit block (COT layer) B4 as an example with reference to FIG. 1, FIG. 3 and FIG. 4, a coating unit 32 for performing coating treatment of a resist solution to the wafer W is provided as the solution treatment unit, and heating units (CLHP4) for performing heating processing on the wafer W after resist solution is applied, and hydrophobic treatment units (ADH) for improving adhesion between the resist solution and the wafer W are provided in the shelf units U1 to U4 in the unit block (COT layer) B4, and the unit block (COT layer) B4 is thus configured similarly to the unit blocks (DEV layers) B1 and B2. More specifically, the coating unit 32 is partitioned from the heating units (CLHP4) and the hydrophobic treatment units (ADH) by a transfer region R4 of the main arm A4 (a horizontal moving region of the main arm A4). In the unit block (COT layer) B4, the main arm A4 delivers the wafer W to the delivery stage TRS1 in the shelf unit U5, the coating unit 32, and the treatment and processing units in the shelf units U1 to U4. Note that the hydrophobic treatment unit (ADH), which performs gas treatment in an LMDS atmosphere, may be provided in any one of the coating film forming unit blocks B3 to B5.

In the unit block (BCT layer) B3, a first anti-reflection film forming unit 33 for performing treatment of forming a first anti-reflection film to the wafer W is provided as the solution treatment unit, and heating units (CLHP3) for performing heating processing on the wafer W after the anti-reflection film forming treatment are provided in the shelf units U1 to U4, and the unit block (BCT layer) B3 is thus configured similarly to the unit block (COT layer) B4. More specifically, the first anti-reflection film forming unit 33 is partitioned from the heating units (CLHP3) by a transfer region R3 of the main arm A3 (a horizontal moving region of the main arm A3). In this third unit block B3, the main arm A3 delivers the wafer W to the delivery stage TRS1 in the shelf unit U5, the first anti-reflection film forming unit 33, and the treatment and processing units in the shelf units U1 to U4.

The unit block (TCT layer) B5 is configured similarly to the unit block (COT layer) B4 except that a second anti-reflection film forming unit 34 for performing treatment of forming a second anti-reflection film to the wafer W is provided as the solution treatment unit, and heating units (CLHP5) for performing heating processing on the wafer W after the anti-reflection film forming treatment and edge exposure units (WEE) are provided in the shelf units U1 to U4. More specifically, the second anti-reflection film forming unit 34 is partitioned from the heating units (CLHP5) and the edge exposure units (WEE) by a transfer region R5 of the main arm A5 (a horizontal moving region of the main arm A5). In the unit block (TCT layer) B5, the main arm A5 delivers the wafer W to the delivery stage TRS1 in the shelf unit U5, the second anti-reflection film forming unit 34, and the treatment and processing units in the shelf units U1 to U4.

In the transfer regions R1, R3 to R5, the main arms A1, A3 to A5 are provided. The main arms A1, A3 to A5 are configured to deliver the wafer between all of the modules (locations where the wafer W is placed) in the unit blocks (DEV layers) B1 and B2, the unit block (BCT layer) B3, the unit block (COT layer) B4, and the unit block (TCT layer) B5, for example, between the treatment and processing units in the shelf units U1 to U4, the developing units 31, the coating unit 32, the first and second anti-reflection film forming units 33 and 34, and the sections in the shelf unit U5, and are configured to be movable in the horizontal X- and Y-directions and the vertical Z-direction and rotatable around the vertical axis for this end.

FIG. 4 shows an example of the layout of those treatment and processing units, which layout is presented for convenience sake, and the treatment and processing units to be provided are not limited to the heating units (CLHP, PEB, POST), the hydrophobic treatment units (ADH), and the edge exposure units (WEE) but may be other treatment and processing units. In the actual apparatus, the number of units to be installed is determined in consideration of the processing time in each of the treatment and processing units.

In the processing block S2, a shuttle arm A that is a substrate transfer means for delivering the wafer W between the deliver stage TRS2 provided in the shelf unit U5 and a shelf unit U6 on the interface block S3 side is disposed to be movable in the horizontal Y-direction and ascendable and descendable in the vertical Z-direction.

The transfer region of the shuttle arm A and the transfer regions R1, R3 to R5 of the main arms A1, A3 to A5 are partitioned.

A region between the processing block S2 and the carrier block S1 is a delivery region R2 for the wafer W, and in the region R2, as shown in FIG. 1, the shelf unit U5 that is a substrate housing section is provided at a position to which the transfer arm C, the main arms A1, A3 to A5, and the shuttle arm A can access, and a delivery arm D for delivering the wafer W to the shelf unit U5 is provided. In this case, the shelf unit U5 is disposed on an axis of the horizontal movement direction (the Y-direction) of the main arm A1, A3 to A5, and the shuttle arm A, and is provided with a first opening 11 in a proceeding/retracting direction of the main arms A1, A3 to A5 and the shuttle arm A (the Y-direction), and is provided with a second opening 12 in a proceeding/retracting direction of the delivery arm D (the X-direction).

The shelf unit U5 includes, for example, two delivery stages TRS1 and TRS2 to delivery the wafer W to/from the main arms A1, A3 to A5 in the unit blocks B1 to B5 and the shuttle arm A as shown in FIG. 3. The shelf unit U5 further includes housing blocks 10a to 10d partitioned into a plurality of sections in order to correspond to the unit blocks B1 to B5. The housing blocks 10a to 10d include a plurality of mounting shelves BUF1, BUF2, and BUF3, and the cooling plates CPL1 to CPL6 for adjusting the wafer W to a predetermined temperature before resist coating, for adjusting the wafer W to a predetermined temperature before anti-reflection film forming treatment, and for adjusting the wafer W which has been subjected to heating processing after exposure to a predetermined temperature.

The main arms A1, A3 to A5 are similarly configured, and the main arm A4, described as a representative, has an arm main body 80 having, for example, two curved arm portions 81 for supporting a rim region on the rear surface side of the wafer W as shown in FIG. 1. The curved arm portions 81 are configured to freely proceed and retract in the X-direction, to be movable in the Y-direction, ascendable and descendable and rotatable around the vertical axis, and thus can deliver the wafer W to/from the units in the shelf units U1 to U6, the delivery stage TRS1, and the solution treatment units. Driving of such a main arm A4 is controlled by a not-shown controller based on the instruction from a control unit 70. Further, to prevent accumulation of heat in the main arm A1 (A3 to A5) in the heating units, the order of receiving the wafer W can be arbitrarily controlled.

In a region of the processing block S2 adjacent to the interface block S3, the shelf unit U6 is provided at a position to which the main arm A1 and the shuttle arm A can access as shown in FIG. 3. In this example, the shelf unit U6 includes two delivery stages TRS3 and a delivery stage ICPL having a cooling function for delivering the wafer W to/from the shuttle arm A so as to deliver the wafer W to/from the main arm A1 in the unit blocks (DEV layers) B1 and B2 as shown in FIG. 3.

On the other hand, the aligner S4 is connected to the back side of the shelf unit U6 in the processing block S2 via the interface block S3. In the interface block S3, an interface arm E is provided for delivering the wafer W to the sections in the shelf unit U6 corresponding to the unit blocks (DEV layers) B1 and B2 in the processing block S2 and the aligner S4. This interface arm E forms a transfer means for the wafer W intervening between the processing block S2 and the aligner S4, and in this example, the interface arm E is configured to be movable in the horizontal X- and Y-directions and movable in the vertical Z-direction and rotatable around the vertical axis so as to deliver the wafer W to the delivery stages TRS3 and ICPL corresponding to the unit blocks (DEV layers) B1 and B2.

In the resist coating and developing treatment system configured as described above, the above-described delivery arm D can freely deliver the wafer W between the unit blocks B1 to B5 stacked in five tiers via the delivery stages TRS1 and TRS2, and the above-described interface arm E can deliver the wafer W between the processing block S2 and the aligner S4 via the shelf unit U6.

Next, an aspect of processing the wafer W in the resist coating and developing treatment system configured as described above will be described with reference to FIG. 1 to FIG. 4. Note that a case will be described here in which cooling plates CPL9 and CPL10 in two tiers are arranged in the first housing block 10a in the lowermost tier of the housing block 10a to 10d in the shelf unit U5, cooling plates CPL1 and CPL2 in two tiers and a plurality of mounting shelves BUF1 are arranged in the second housing block 10b in the tier upper than the first housing block 10a, cooling plates CPL3 and CPL4 in two tiers and a plurality of mounting shelves BUF2 are arranged in the third housing block 10c in the tier upper than the second housing block 10b, and cooling plates CPL5 and CPL6 in two tiers and a plurality of mounting shelves BUF3 are arranged in the fourth housing block 10d in the tier upper than the third housing block 10c, that is, the uppermost tier.

In the case without anti-reflection film, the carrier 20 is transferred from the outside into the carrier block 21, and a wafer W is taken out of the carrier 20 by the transfer arm C. The wafer W is transferred by the transfer arm C into the delivery stage TRS1 in the shelf unit U5, and then transferred by the delivery arm D to the cooling plate CPL3 in the third housing block 10c in the shelf unit U5, and delivered to the main arm A4 in the unit block (COT layer) B4 via the cooling plate CPL3. The wafer W is then transferred by the main arm A4 to the hydrophobic treatment unit (ADH) and subjected to hydrophobic treatment, and then transferred again to the cooling plate CPL4 in the third housing block 10c in the shelf unit U5 and adjusted to a predetermined temperature. The wafer W taken out of the shelf unit U5 by the main arm A4 is then transferred to the coating unit 32 where a resist film is formed on the wafer W. The wafer W on which the resist film has been formed is transferred by the main arm A4 to the heating unit (CLHP4) and subjected to pre-baking for evaporation of a solvent from the resist film. The wafer W is then housed by the main arm A4 on the mounting shelf BUF2 in the third housing block 10c in the shelf unit U5 and temporarily waits there, and the delivery arm D then enters the mounting shelf BUF2 in the third housing block 10c in the shelf unit U5 and receives the wafer W and delivers the wafer W to the delivery stage TRS2 in the shelf unit U5. Subsequently, the wafer W is transferred by the shuttle arm A to the delivery stage ICPL in the shelf unit U6. The wafer W on the delivery stage ICPL is then transferred by the interface arm E to the aligner S4 and subjected to predetermined exposure processing.

The wafer W after exposure processing is transferred by the interface arm E to the delivery stage TRS3 in the shelf unit U6 in order that the wafer W is delivered to the unit block (DEV layer) B1 (or the unit block (DEV layer) B2), and the wafer W on the stage TRS3 is received by the main arm A1 in the unit block (DEV layer) B1 (or the unit block (DEV layer) B2), and then first subjected to heating processing in the heating unit (PEB1) in the unit block (DEV layer) B1 (or B2), and then transferred by the main arm A1 to the cooling plate CPL7 (CPL8) in the shelf unit U6 and adjusted to a predetermined temperature. Subsequently, the wafer W is taken out by the main arm A1 from the shelf unit U6 and transferred to the developing unit 31 and coated with a developing solution. The wafer W is then transferred by the main arm A1 to the heating unit (POST1) and subjected to a predetermined developing treatment. The wafer W which has been subjected to the developing treatment is transferred to the CPL 9 (CPL10) in the first housing block 10a in the shelf unit U5 and adjusted to a predetermined temperature in order that the wafer W is delivered to the transfer arm C, and then returned by the transfer arm C to the original carrier 20 mounted in the carrier block S1.

When an anti-reflection film is formed on the lower side of the resist film, the wafer W is delivered from the transfer arm C to the delivery arm D, and then transferred by the delivery arm D to the cooling plate CPL1 in the second housing block 10b in the shelf unit U5 and delivered to the main arm A3 in the unit block (BCT layer) B3 via the cooling plate CPL1.

In the unit block (BCT layer) B3, the wafer W is transferred by the main arm A3 from the first anti-reflection film forming unit 33 to the heating unit (CLHP3), and then to the mounting shelf BUF1 in the second housing block 10b in the shelf unit U5, whereby the first anti-reflection film is formed on the wafer W. The wafer W mounted on the mounting shelf BUF1 in the second housing block 10b is transferred by the delivery arm D to the cooling plate CPL3 (CPL4) in the third housing block 10c and adjusted to a predetermined temperature.

Subsequently, the wafer W in the third housing block 10c is transferred by the main arm A3 from the coating unit 32 to the heating unit CLHP4, and then to the mounting shelf BUF2 in the third housing block 10c in the shelf unit U5, whereby the resist film is formed on the first anti-reflection film.

The delivery arm D then enters the mounting shelf BUF2 in the third housing block 10c in the shelf unit U5 and receives the wafer W, and delivers the wafer W to the delivery stage TRS2 in the shelf unit U5. Subsequently, the wafer W is transferred by the shuttle arm A to the delivery stage ICPL in the shelf unit U6. The wafer W on the delivery stage ICPL is subsequently transferred by the interface arm E to the aligner S4, where the wafer W is subjected to predetermined exposure processing. Thereafter, the developing treatment is performed in a process similar to that described above.

When an anti-reflection film is formed on the upper side of the resist film, the wafer W is delivered by the main arm A4 from the hydrophobic treatment unit (ADH) to the cooling plate CPL4 in the third housing block 10c in the shelf unit U5 and adjusted to a predetermined temperature, and the wafer W taken out of the shelf unit U5 by the main arm A4 is transferred to the coating unit 32, where a resist film is formed on the wafer W. The wafer W on which the resist film has been formed is transferred by the main arm A4 to the heating unit (CLHP4) and subjected to pre-baking for evaporation of a solvent from the resist film. The wafer W is then housed by the main arm A4 on the mounting shelf BUF2 in the third housing block 10c in the shelf unit U5 and temporarily waits there.

The wafer W in the third housing block 10c is subsequently transferred by the delivery arm D to the cooling plate CPL5 (CPL6) in the fourth housing block 10d in the shelf unit U5 and adjusted to a predetermined temperature, and then delivered to the main arm A5 in the unit block (TCT layer) B5. In the unit block (TCT layer) B5, the wafer W is transferred by the main arm A5 from the second anti-reflection film forming unit 34 to the heating unit (CLHP5), and then to the mounting shelf BUF3 in the fourth housing block 10d in the shelf unit U5, whereby the second anti-reflection film is formed on the wafer W. In this case, after the heating processing by the heating unit (CLHP5), the wafer W may be transferred to the edge exposure unit (WEE) and subjected to edge exposure processing, and then transferred to the mounting shelf BUF3 in the fourth housing block 10d in the shelf unit U5.

The delivery arm D then enters the mounting shelf BUF3 in the fourth housing block 10d in the shelf unit U5 and receives the wafer W, and delivers the wafer W to the delivery stage TRS2 in the shelf unit U5. Subsequently, the wafer W is transferred by the shuttle arm A to the delivery stage ICPL in the shelf unit U6. The wafer W on the delivery stage ICPL is then transferred by the interface arm E to the aligner S4 and subjected to predetermined exposure processing. Thereafter, the developing treatment is performed in a process similar to that described above.

Note that when anti-reflection films are formed on the lower side and the upper side of the resist film, the above-described transfer processing to form the anti-reflection film on the lower side of the resist film and transfer processing to form the anti-reflection film on the upper side of the resist film can be combined to form the anti-reflection films are formed on the lower side and the upper side of the resist film.

The above-described coating and developing treatment apparatus comprises the control unit 70 composed of a computer for performing management of recipes for the treatment and processing units, schedule management for the transfer flow (transfer path) of the wafer W, treatment and processing in the treatment and processing units, and drive control of the main arms A1, A3 to A5, the transfer arm C, the deliver arm D, and the interface arm E. This control unit 70 uses the unit blocks B1 to B5 to transfer the wafer W and perform treatment and processing.

The schedule of the transfer flow designates the transfer path (transfer order) of the wafer W in the unit block, and created for each of the unit blocks B1 to B5 depending on the kind of a coating film to be formed, whereby a plurality of transfer flow schedules are stored in the schedule control unit 70 for each of the unit blocks B1 to B5.

Further, depending on the coating film to be formed, there provided are: a mode of transferring the wafer W to all of the unit blocks B1 to B5; a mode of transferring the wafer W to unit blocks (DEV layers B1 and B2) where developing treatment is performed, the unit block (COT layer B4) where coating of the resist solution is performed, and the unit block (BCT layer B3) for forming the first anti-reflection film; a mode of transferring the wafer W to unit blocks (DEV layers B1 and B2) where developing treatment is performed, the unit block (COT layer B4) where coating of the resist solution is performed, and the unit block (TCT layer B5) for forming the second anti-reflection film; and a mode of transferring the wafer W only to the unit blocks (DEV layers B1 and B2) where developing treatment is performed, so that a mode selecting means of the control unit 70 selects the unit blocks to which the wafer W is transferred depending on the kind of the coating film to be formed, and selects an optimal recipe from the plurality of transfer flow schedules prepared for each of the selected unit blocks, whereby the unit blocks to be used are selected according to the coating film to be formed, and driving of the treatment and processing units and arms is controlled in those unit blocks so that a series of processing is performed.

In such a coating and developing treatment apparatus, the coating film forming unit blocks and the developing treatment unit block are provided in different areas and the respective dedicated main arms A1, A3 to A5 and the shuttle arm A are provided, so that the loads to the arms A1, A3 to A5, and A are reduced. This improves the transfer efficiencies of the arms A1, A3 to A5, and A, with the effect that the throughput can be increased.

Next, a case in which the substrate treatment apparatus according to the present invention is applied to the coating unit 32 will be described in detail with reference to FIG. 5 to FIG. 7.

Figure 5:
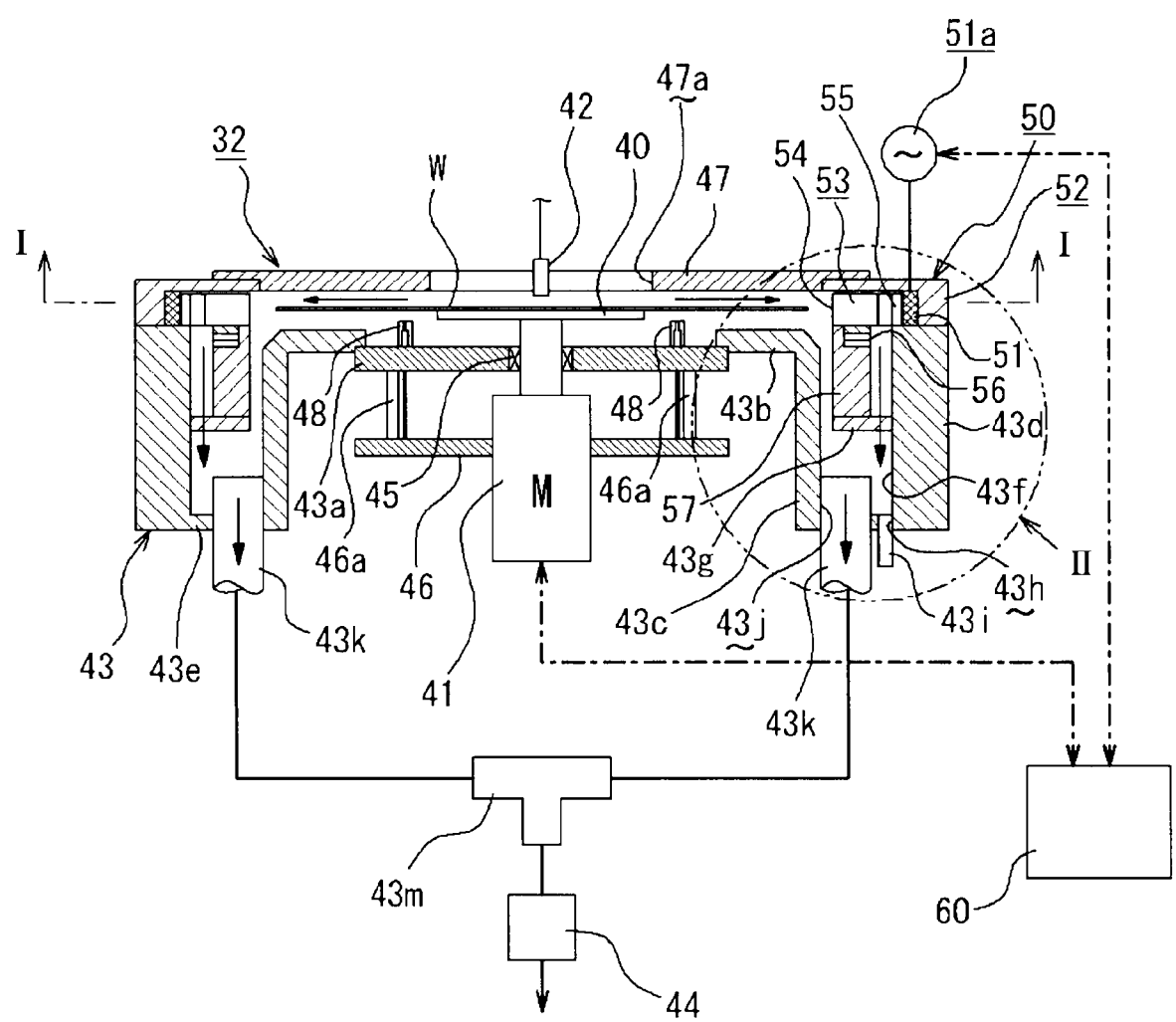
FIG. 5 is an explanatory view schematically showing a longitudinal section of an example in which the substrate treatment apparatus according to the present invention is applied to a resist coating unit.
Figure 6:
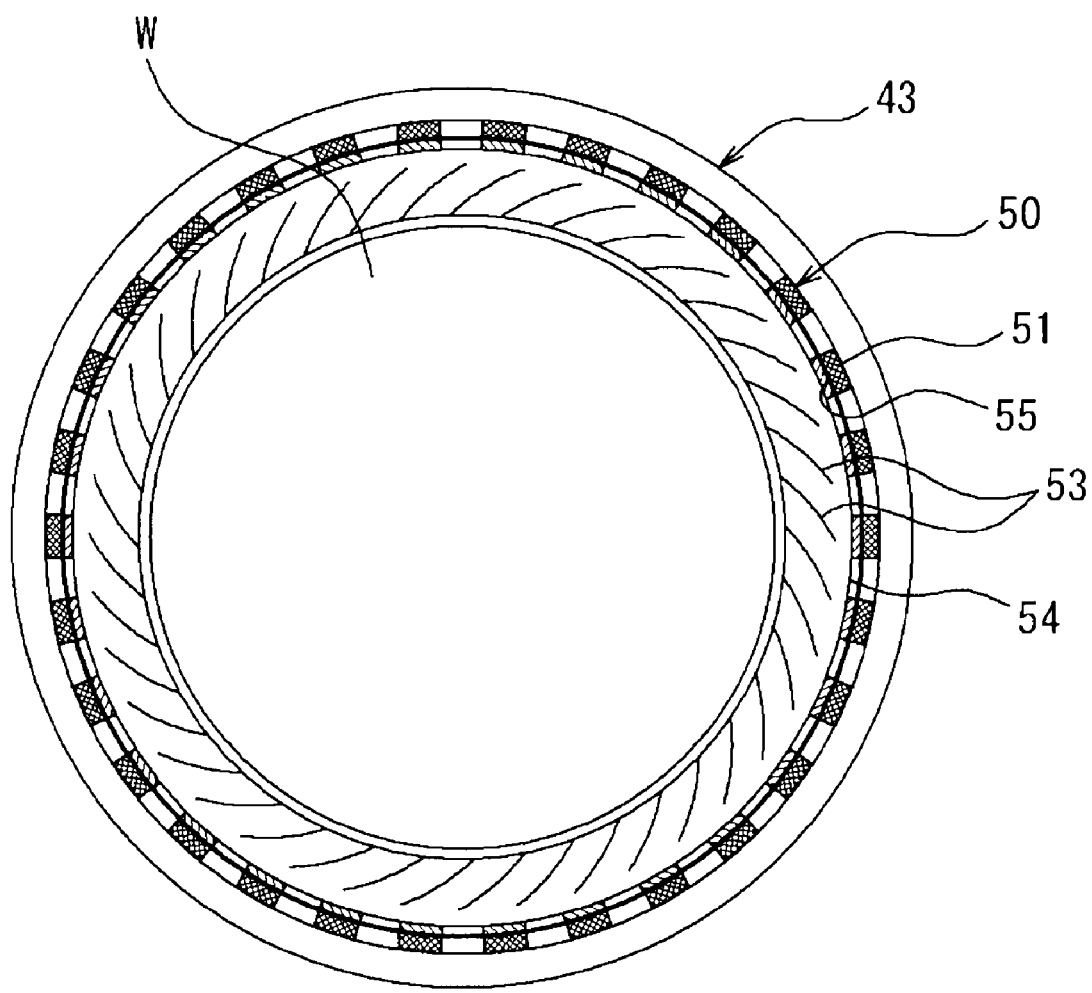
FIG. 6 is a sectional view taken along a line I-I in FIG. 5.
Figure 7:
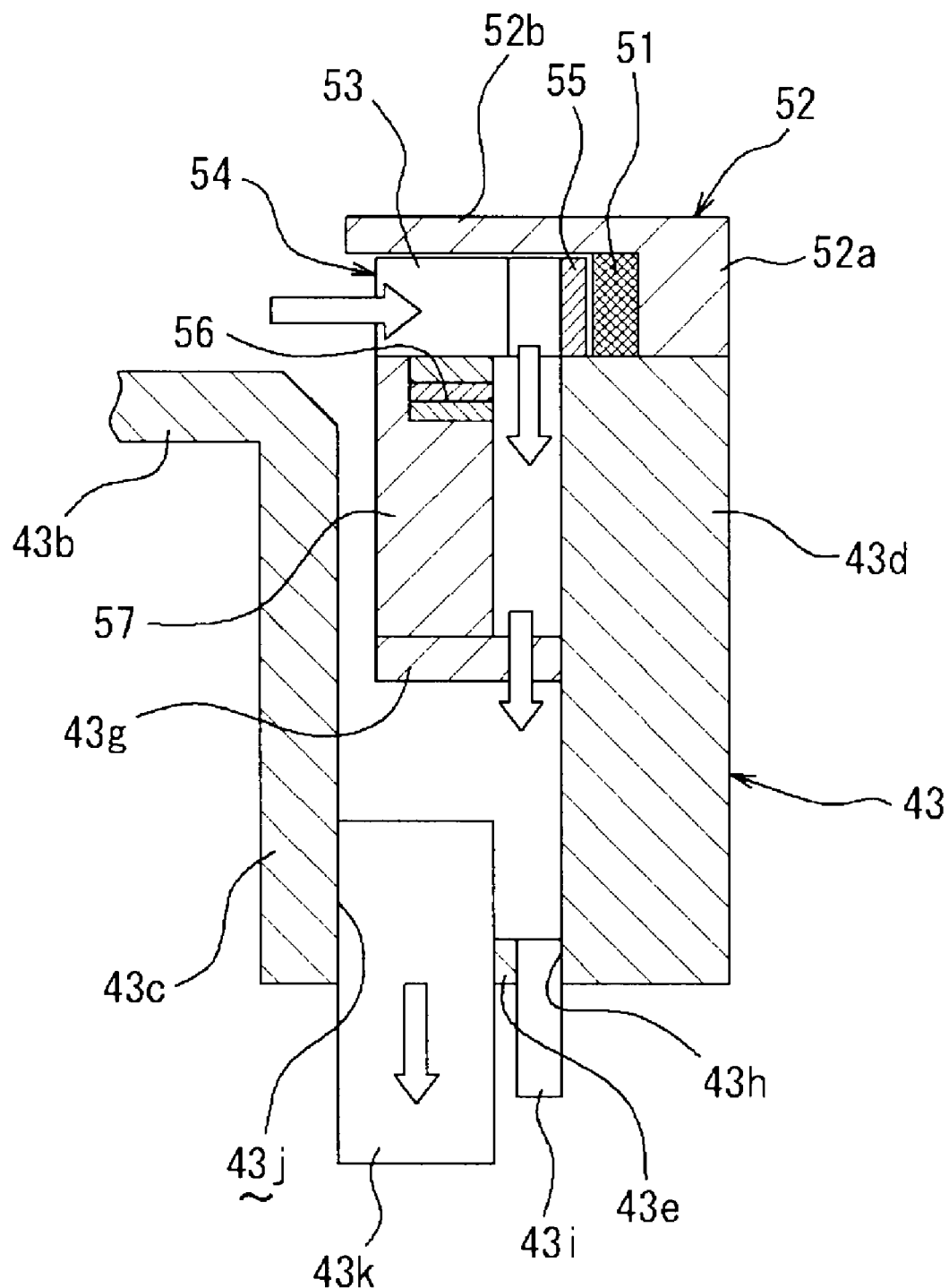
FIG. 7 is an enlarged sectional view of a II part in FIG. 5.
Figure 8:
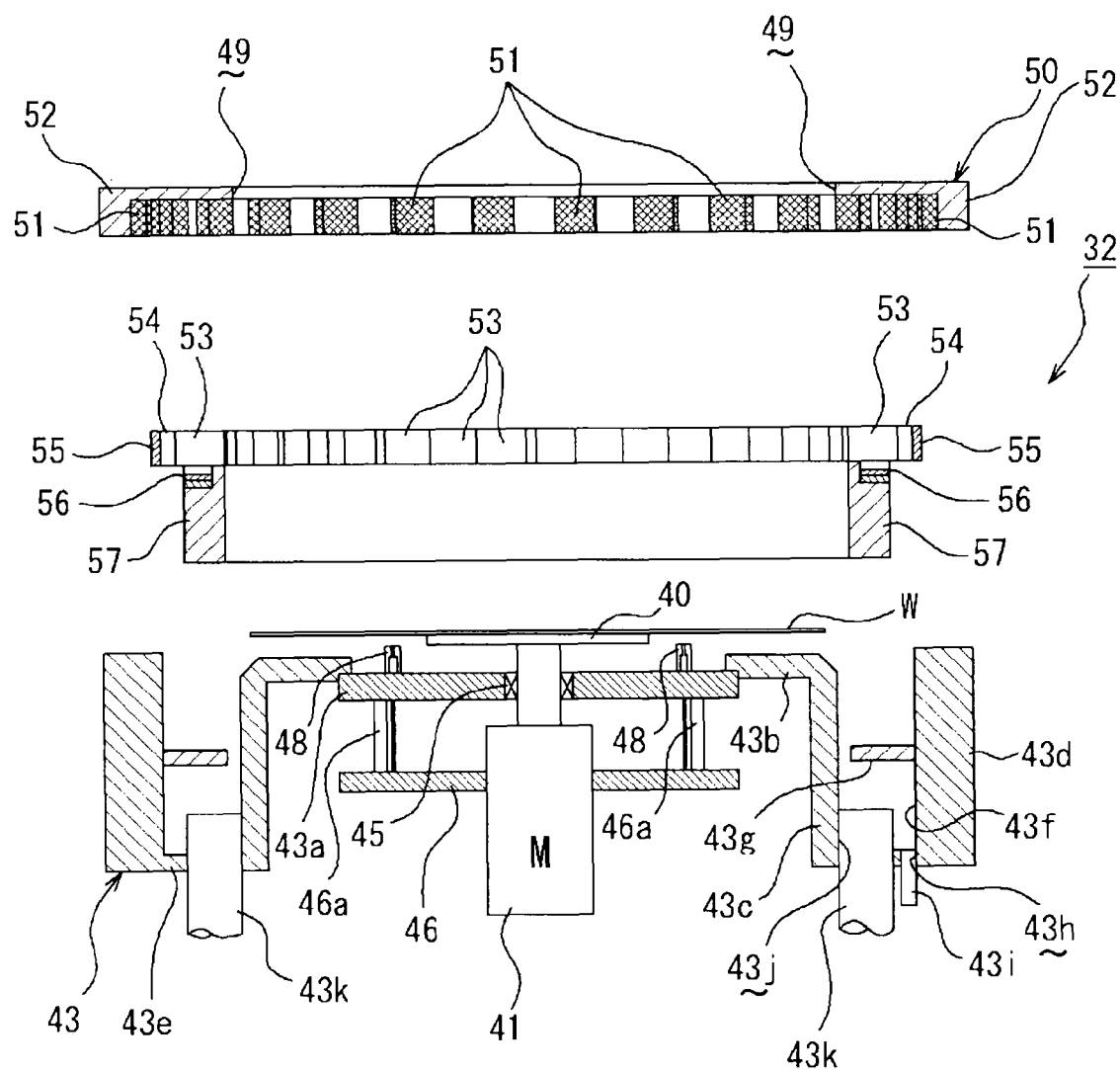
FIG. 8 is an exploded sectional view of the resist coating unit in FIG. 5.

FIG. 5 is a schematic sectional view showing the resist coating unit 32 that is the substrate treatment apparatus according to the present invention, and FIG. 6 is a sectional view taken along a line I-I in FIG. 5.

The resist coating unit 32 comprises a spin chuck 40 being a holding means for rotatably holding the wafer W, a motor 41 being a rotation means for rotationally driving the spin chuck 40, a treatment solution supply nozzle 42 (hereinafter, referred to as a resist nozzle 42) for supplying (discharging) a treatment solution, for example, a resist solution to the front surface of the wafer W held on the spin chuck 40, a treatment container 43 for accommodating the wafer W with its upper end open, an exhaust means 44 for exhausting a gas from the bottom of the treatment container 43, and a multiblade centrifugal fan 50 disposed on the inner periphery side of the treatment container 43 for flowing airflow on the front surface side of the wafer W to the exhaust means 44 side.

The treatment container 43 comprises a circular base portion 43a for rotatably supporting a rotation shaft 40a of the spin chuck 40 such that the rotation shaft 40a is inserted through the circular base portion 43a with, for example, a magnetic fluid sealing member 45 intervening therebetween; an inner peripheral wall 43c hanging from the tip of an annular piece 43b extending at the outer periphery of the circular base portion 43a; an outer peripheral wall 43d located at the outer peripheral side of the inner peripheral wall 43c with a space therebetween; a peripheral groove portion 43f formed by the inner peripheral wall 43c, the outer peripheral wall 43d, and a bottom portion 43e linking their lower ends; and an annular mounting portion 43g provided inwardly protruding from a middle location on the inner peripheral surface of the outer peripheral wall 43d.

The multiblade centrifugal fan 50 is detachably mounted on the top end portion of the outer peripheral wall 43d of the treatment container 43 and on the top of the mounting portion 43g, and fixed by a not-shown fixing member.

The motor 41 is fixed to a fixing member 46 supported by a supporting member 46a hanging from the lower portion of the treatment container 43.

The multiblade centrifugal fan 50 has a coil holder 52 for holding an annular electromagnetic coil 51 attached on its inner peripheral side, a fan main body 54 having many radial fins 53, an annular permanent magnet 55 attached to the outer periphery of the fan main body 54 and facing the inner side of the annular electromagnetic coil 51, and a cylindrical support body 57 for supporting the fan main body 54 via a thrust bearing 56 such that the fan main body 54 is horizontally rotatable.

The coil holder 52 for holding the annular electromagnetic coil 51 attached thereto, the fan main body 54, the annular permanent magnet 55, the thrust bearing 56, and the cylindrical support body 57 are individually configured to be attachable to and detachable from the treatment container 43.

In this case, the coil holder 52 is composed of a cylindrical base portion 52a fixed to the top end of the outer peripheral wall 43d of the treatment container 43 by a not-shown fixing member, for example, a fixing bolt and an inward flange portion 52b inwardly extending from the top end of the cylindrical base portion 52a, and holds the annular electromagnetic coil 51 attached to the inner peripheral surface of the cylindrical base portion 52a and the lower surface on the base end of the inward flange portion 52b. The inner diameter of the inward flange portion 52b has a dimension that is slightly greater than that of the outer diameter of the wafer W. With the multiblade centrifugal fan 50 attached to the treatment container 43, the lower surface of the inward flange portion 52b covers the upper surface of the fan main body 54 of the multiblade centrifugal fan 50. Note that with the multiblade centrifugal fan 50 attached to the treatment container 43, a lid body 47 having an air supply port 47a at its middle portion is capped on the opening side of the treatment container 43, that is, on the upper surface of the inward flange portion 52b of the coil holder 52. This lid body 47 is ascendable and descendable with respect to the treatment container 43 by a not-shown ascending and descending mechanism, so that the lid body 47 is moved to above the treatment container 43 when the wafer W is transferred to the spin chuck 40 and is capped on the opening of the treatment container 43 during treatment.

The multiblade centrifugal fan 50 configured as described above is disposed such that the fan main body 54 is placed at a height position including (covering) the position (height position) of the front surface of the wafer W held on the spin chuck 40. This allows turbulent airflow occurring on the front surface of the wafer W to efficiently flow in the radial direction of the wafer W.

The motor 41 driving the spin chuck 40 and a drive power supply 51a for exciting the annular electromagnetic coil 51 of the multiblade centrifugal fan 50 are individually electrically connected to a controller 60 being a control means, and configured such that the number of rotations of the multiblade centrifugal fan 50 is controlled corresponding to the number of rotations of the motor 41, that is, the number of rotations of the wafer W. In this case, the number of rotations of the multiblade centrifugal fan 50 is preferably set to be proportional to the number of rotations of the wafer W. Further, a way may be employed which automatically sets the control amount proportional to the square of the number of rotations of the wafer W to the number of rotations of the multiblade centrifugal fan 50.

On the outer peripheral side of the bottom portion 43e of the peripheral groove portion 43f of the treatment container 43, a drain port 43h is provided to which a drain pipe 43i is connected. Further, through ports 43j are provided at a plurality of locations in the peripheral groove portion 43f, and exhaust pipes 43k are inserted into the through ports 43j such that the open ends of the exhaust pipes 43k are located slightly above the through ports 43j, and each of the exhaust pipes 43k is connected to the exhaust means, for example, the exhauster 44 via a coupling 43m.

Rinse nozzles 48 for discharging a rinse solution, for example, pure water toward the inner side of the rear surface and the edge side of the wafer W are attached to the circular base portion 43a of the treatment container 43.

According to the resist coating unit configured as described above, the number of rotations of the multiblade centrifugal fan 50 can be controlled corresponding to the number of rotations of the wafer W, so that an appropriate amount of exhaust according to the amount of airflow generated in the treatment container 43 accompanying the rotation of the wafer W can be exhausted and the turbulent airflow flowing in the circumferential direction of the wafer W generated during rotation of the wafer W at a high speed can be corrected to laminar airflow flowing in a radial direction (in a direction of radius) of the wafer W.

Figure 9:
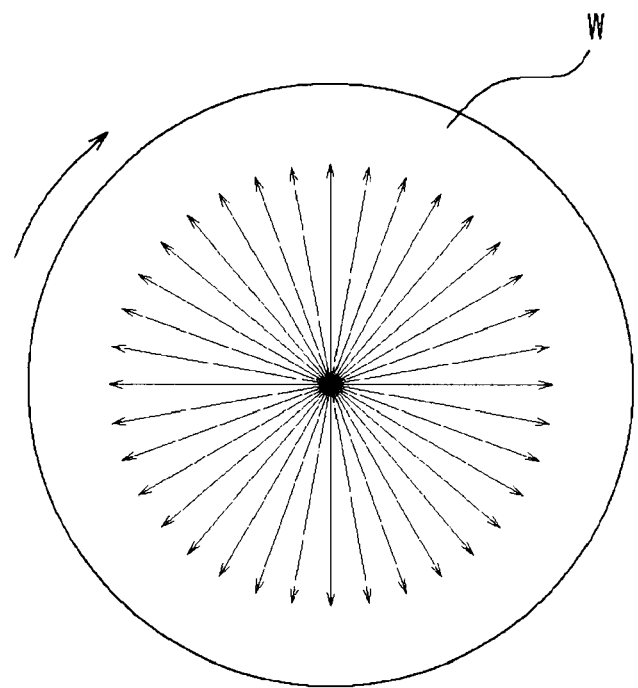
FIG. 9 is a schematic plan view showing a state of laminar airflow occurring on a front surface of the wafer.
Figure 10:
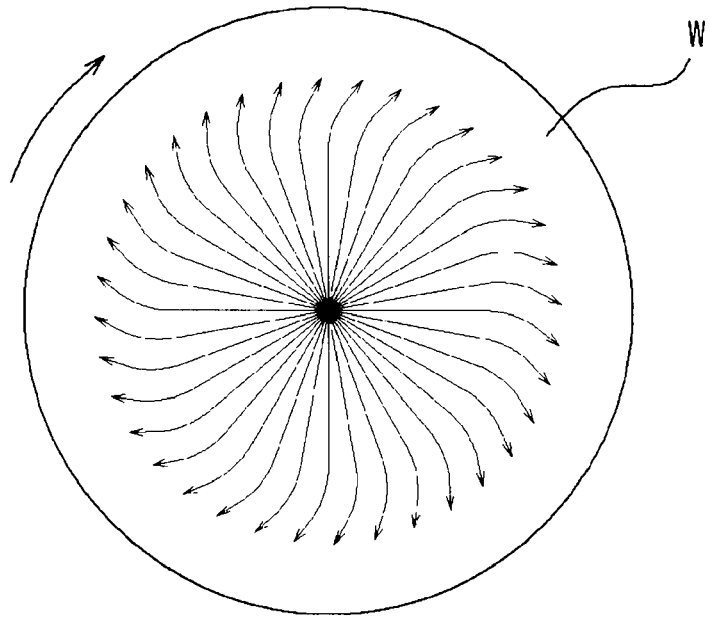
FIG. 10 is a schematic plan view showing turbulent airflow occurring on the front surface of the wafer.
Figure 11A:
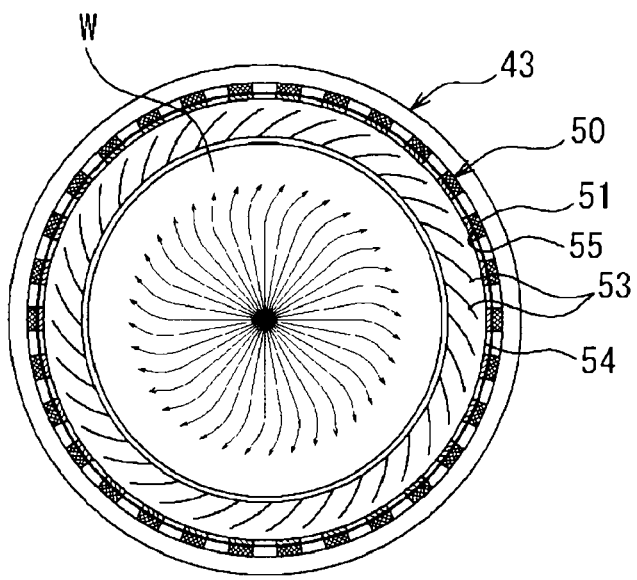
FIG. 11A is a schematic plan view showing a state before correcting the turbulent airflow to laminar airflow by a multi-blade centrifugal fan in the present invention.

More specifically, as shown in FIG. 9, when the rotation of the wafer W is stopped or at a low speed, the airflow on the wafer W is laminar airflow flowing in the radial direction (in a direction of radius) of the wafer W, and therefore the rotation of the multiblade centrifugal fan 50 does not need to be controlled. However, when the wafer W is rotated at a high speed, the airflow on the wafer W becomes turbulent airflow flowing in the circumferential direction of the wafer W as shown in FIG. 10 and FIG. 11A to cause a decrease in film quality due to irregularity in thickness of the resist film.

Figure 11B:
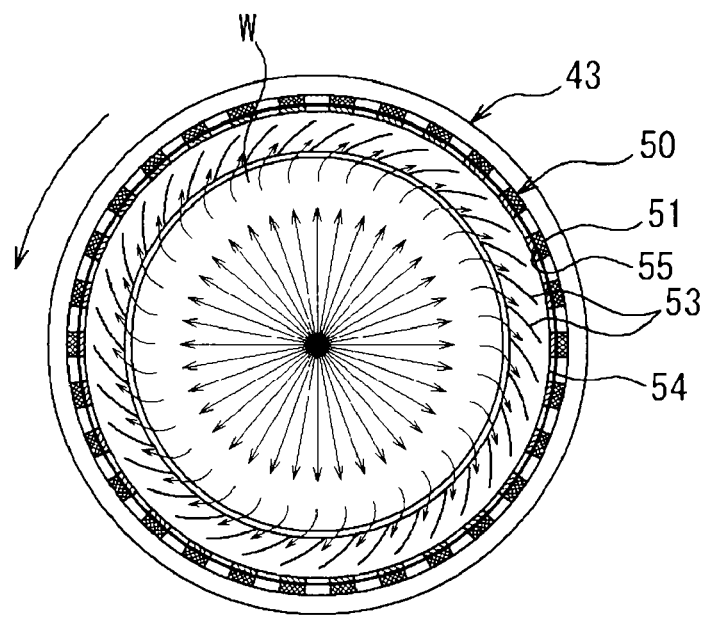
FIG. 11B is a schematic plan view showing a state after the correction.

Hence, a control signal from the controller 60 is transmitted to the multiblade centrifugal fan 50 to correct the turbulent airflow flowing in the circumferential direction above the front surface of the wafer W generated due to the rotation of the wafer W to the laminar airflow flowing in the radial direction as shown in FIG. 11B. Further, by exhausting an appropriate amount of air according to the amount of the airflow generated in the treatment container 43 accompanying the rotation of the wafer W, mist can be efficiently collected by the exhaust means 44.

Since the coil holder 52 for holding the annular electromagnetic coil 51 attached thereto, the fan main body 54, the annular permanent magnet 55, the thrust bearing 56, and the cylindrical support body 57 are individually formed to be attachable to and detachable from the treatment container 43, so that the parts constituting the multiblade centrifugal fan 50 can be attached to and detached from the treatment container 43. Further, the maintenance check of the multiblade centrifugal fan 50 and the treatment container 43 can be facilitated.

Next, an example of the operation aspect of the resist coating unit 32 will be described with reference to Table 1.

TABLE 1

| Step | Time (s) | Discharge | Wafer Rotation Number (rpm) | Fan Rotation Number (rpm) | Exhaust |
|---|---|---|---|---|---|
| 1 | 2.0 |  | 0 | 100 | Low Exhaust |
| 2 | 4.0 | Resist | 0 | 100 | Low Exhaust |
| 3 | 1.0 |  | 0 | 200 | Middle + Exhaust |
| 4 | 2.0 |  | 1500 | 200 | Middle + Exhaust |

TABLE 1-continued

| Step | Time (s) | Discharge | Wafer Rotation Number (rpm) | Fan Rotation Number (rpm) | Exhaust |
|---|---|---|---|---|---|
| 5 | 15.0 | | 1500 | 200 | Middle + Exhaust |
| 6 | 5.0 | | 1500 | 200 | Middle + Exhaust |
| 7 | 5.0 | Side Rinse, Back Rinse | 1000 | 150 | Middle Exhaust |
| 8 | 1.0 | | 1000 | 300 | High Exhaust |
| 9 | 5.0 | | 2000 | 300 | High Exhaust |
| 10 | 1.0 | | 0 | 100 | Low Exhaust |

First, a wafer W transferred by the main arm A4 is received by the spin chuck 40, and the lid body 47 is then capped on the opening of treatment container 43. In this state, the multiblade centrifugal fan 50 is rotated at 100 rpm to perform low exhaust (Step 1).

Then, the resist nozzle 42 is moved to above the center of the wafer W and discharges (supplies) the resist solution to the front surface of the wafer W (Step 2). Thereafter, with the rotation of the wafer W stopped, the multiblade centrifugal fan 50 rotates at 200 rpm to bring the exhaust into a (middle+) exhaust state that is slightly higher than a middle level (Step 3).

In this state, the rotation of the wafer W is brought to a high speed rotation at 1500 rpm so that a resist film is formed on the front surface of the wafer W (Steps 4, 5 and 6). In this event, turbulent airflow flowing in the circumferential direction of the wafer W tries to occur above the front surface of the wafer W, but the number of rotations of the multiblade centrifugal fan 50 is controlled corresponding to the number of rotations of the wafer W, so that the airflow is corrected to laminar airflow flowing in the radial direction (in the direction of radius) of the wafer W (see FIG. 11B). Further, by exhausting an appropriate amount of air according to the amount of airflow generated in the treatment container 43 accompanying the rotation of the wafer W, the mist can be efficiently collected by the exhaust means 44.

After completion of the resist coating, the rotation of the wafer W is brought to 1000 rpm, and the rinse nozzles 48 discharge the rinse solution (pure water) to the inner side of the rear surface and the edge side of the wafer W to thereby perform rinse treatment. In this event, the multiblade centrifugal fan 50 rotates at 150 rpm to create a middle exhaust state (Step 7).

After completion of the rinse treatment, the rotation of the wafer W is not changed, but the rotation of the multiblade centrifugal fan 50 is brought to a high speed rotation at 300 rpm to create a high exhaust state (Step 8) and, in this state, the wafer W is rotated at a high speed (2000 rpm) to be subjected to spin dry processing (Step 9).

After completion of the dry processing, the rotation of the wafer W is stopped, and the multiblade centrifugal fan 50 is rotated at 100 rpm as in the initial period to create a low exhaust state (Step 10). Thereafter, when the lid body 47 is raised to open the opening of the treatment container 43, the main arm A4 enters the opening of the treatment container 43 and receives the wafer W from the spin chuck 40 and transfers it to the next processing or treatment unit.

Next, a case in which the substrate treatment apparatus according to the present invention is applied to the developing unit 31 will be described in detail with reference to FIG. 12.

Figure 12:
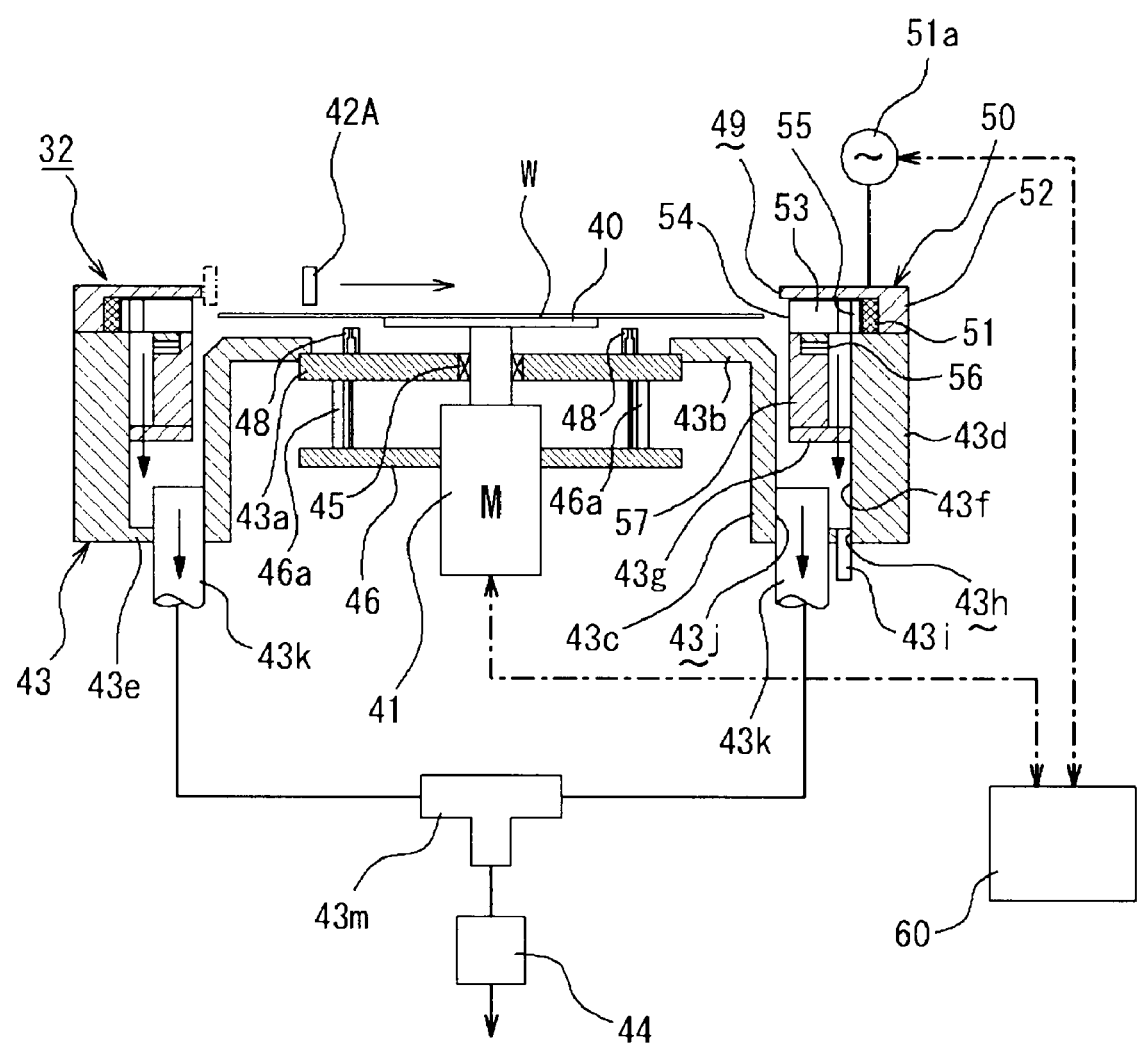
FIG. 12 is an explanatory view schematically showing a longitudinal section of an example in which the substrate treatment apparatus according to the present invention is applied to a developing treatment unit.

FIG. 12 is a schematic sectional view showing the developing treatment unit 31 that is the substrate treatment apparatus according to the present invention. Since the developing treatment unit 31 essentially has the same configuration as that of the resist coating unit 32, and therefore the same numerals are given to the same portions, and different parts will be described here.

The developing treatment unit 31 comprises a developing solution nozzle 42A that is a treatment solution supply nozzle which is moved in parallel relative to the front surface of the wafer W by a not-shown moving mechanism. Though not shown, the developing solution nozzle 42A has a developing solution discharge port in a slit shape having at least the same dimension as the width of the wafer W, and a rinse solution supply port in parallel to the developing solution discharge port in the moving direction. Further, the opening portion 49 of the treatment container 43 is opened, and the developing solution nozzle 42A inserted into the treatment container 43 through the opening portion 49 is reciprocated from one end to the other end of the wafer W held on the spin chuck 40.

Next, an example of the operation aspect of the developing treatment unit 31 will be described with reference to Table 2.

TABLE 2

| Step | Time (s) | Discharge | Wafer Rotation Number (rpm) | Fan Rotation Number (rpm) | Exhaust |
|---|---|---|---|---|---|
| 1 | 1.0 | | 500 | 120 | Low + Exhaust |
| 2 | 1.0 | Rinse | 500 | 120 | Low + Exhaust |
| 3 | 1.0 | Rinse | 500 | 120 | Low + Exhaust |
| 4 | 1.0 | Developing Solution | 500 | 120 | Low + Exhaust |
| 5 | 1.0 | Developing Solution | 500 | 120 | Low + Exhaust |
| 6 | 8.0 | Developing Solution | 500 | 120 | Low + Exhaust |
| 7 | 1.0 | | 500 | 150 | Middle Exhaust |
| 8 | 5.0 | Rinse, Back Rinse | 1000 | 150 | Middle Exhaust |
| 9 | 10.0 | Rinse, Back Rinse | 1000 | 150 | Middle Exhaust |
| 10 | 10.0 | | 2000 | 300 | High Exhaust |
| 11 | 5.0 | | 2000 | 300 | High Exhaust |
| 12 | 0.5 | | 0 | 100 | Low Exhaust |

First, a wafer W transferred by the main arm A1 is received by the spin chuck 40. Thereafter, the wafer W is rotated (at 500 rpm) and the multiblade centrifugal fan 50 is rotated at 120 rpm to perform low+exhaust that is slightly higher than low exhaust (Step 1). In this state, the developing solution nozzle 42A is reciprocated from one end to the other end of the wafer W while discharging (supplying) the rinse solution (pure water) to the front surface of the wafer W (Steps 2 and 3).

Then, the developing solution nozzle 42A is reciprocated from one end to the other end of the wafer W while discharging (supplying) the developing solution, the developing solution nozzle 42A is then moved to above the central portion of the wafer W to perform developing treatment (Steps 4, 5, and 6). Thereafter, the rotation of the wafer W is not changed, but the multiblade centrifugal fan 50 is rotated at 150 rpm to create a middle exhaust state (Step 7). In this event, turbulent airflow flowing in the circumferential direction of the wafer W tries to occur above the front surface of the wafer W, but the number of rotations of the multiblade centrifugal fan 50 is controlled corresponding to the number of rotations of the wafer W, so that the airflow is corrected to laminar airflow flowing in the radial direction (in the direction of radius) of the wafer W (see FIG. 11B). Further, by exhausting an appropriate amount of air according to the amount of airflow generated in the treatment container 43 accompanying the rotation of the wafer W, the mist can be efficiently collected by the exhaust means 44.

After completion of the developing treatment, the rotation of the wafer W is brought to 1000 rpm, and the rinse nozzles 48 discharge the rinse solution (pure water) to the inner side of the rear surface and the edge side of the wafer W to thereby perform rinse treatment (Steps 8 and 9).

After completion of the rinse treatment, the wafer W is rotated at a high speed (2000 rpm) to be subjected to spin dry processing (Steps 10 and 11). In this event, the rotation of the multiblade centrifugal fan 50 is brought to a higher speed rotation at 300 rpm to create a high exhaust state.

After completion of the dry processing, the rotation of the wafer W is stopped, and the multiblade centrifugal fan 50 is rotated at 100 rpm as in the initial period to create a low exhaust state (Step 12). Thereafter, the main arm A1 enters the treatment container 43 via the opening portion 49 of the treatment container 43 and receives the wafer W from the spin chuck 40 and transfers it to the next processing or treatment unit.

Though a case in which the substrate treatment apparatus according to the present invention is applied in the resist coating and developing treatment system for a semiconductor wafer has been described in the above embodiments, the substrate treatment apparatus according to the present invention is also applicable in a resist coating and developing treatment system for an LCD glass substrate.

What is claimed is:

1. A substrate treatment apparatus comprising a holding means for rotatably holding a substrate to be treated; a rotation means for rotationally driving said holding means; a treatment solution supply nozzle for supplying a treatment solution onto the substrate to be treated held on said holding means; a treatment container with an upper surface open for housing said holding means; and an exhaust means for exhausting air from a bottom of said treatment container, further comprising:
   a multiblade centrifugal fan provided on an inner periphery side of said treatment container for flowing airflow on a front surface side of the substrate to be treated to said exhaust means side; and
   a control means connected to said rotation means and a drive unit for said multiblade centrifugal fan for controlling a number of rotations of said multiblade centrifugal fan corresponding to a number of rotations of the substrate to be treated by said rotation means,
   wherein a control signal from said control means is transmitted to said multiblade centrifugal fan so that turbulent airflow flowing in a circumferential direction on the front surface of the substrate to be treated generated due to the rotation of the substrate to be treated is corrected to laminar airflow flowing in a radial direction, and
   wherein said multiblade centrifugal fan comprises an annular electromagnetic coil disposed on the inner periphery side of said treatment container, a fan main body having many radial fins, an annular magnet attached to an outer periphery of said fan main body and facing an inner side of said annular electromagnetic coil, and a support body for rotatably supporting said fan main body on the inner periphery side of said treatment container via a thrust bearing, and said multiblade centrifugal fan is mounted on a mounting portion provided protruding on an inner peripheral surface of said treatment container.

2. The substrate treatment apparatus as set forth in claim 1, wherein said multiblade centrifugal fan is disposed at a height position including a position of the front surface of the substrate to be treated held on said holding means.

3. The substrate treatment apparatus as set forth in claim 1, further comprising:
   a coil holder for holding said annular electromagnetic coil attached thereto,
   wherein said coil holder, said fan main body, said annular magnet, said thrust bearing, and said support body are individually attachable to and detachable from said treatment container.

4. The substrate treatment apparatus as set forth in claim 1, wherein said control means controls the number of rotations of said multiblade centrifugal fan in proportion to a square of the number of rotations of the substrate to be treated.

5. The substrate treatment apparatus as set forth in claim 1, wherein said control means conducts a control of increasing the number of rotations of said multiblade centrifugal fan before increasing the number of rotations of the substrate to be treated.

6. A substrate treatment apparatus comprising a holding means for rotatably holding a substrate to be treated; a rotation means for rotationally driving said holding means; a treatment solution supply nozzle for supplying a treatment solution onto the substrate to be treated held on said holding means; a treatment container with an upper end open for housing said holding means; and an exhaust means for exhausting air from a bottom of said treatment container, further comprising:
   a multiblade centrifugal fan disposed on an upper end portion of said treatment container and at a height position including a position of a front surface of the substrate to be treated held on said holding means for flowing airflow on the front surface side of the substrate to be treated to said exhaust means side,
   wherein said multiblade centrifugal fan comprises a fan main body having many radial fins, an annular electromagnetic coil disposed on an outer side of said fan main body, and an annular magnet attached to an outer periphery of said fan main body and facing an inner side of said annular electromagnetic coil, and
   wherein said fan main body and said annular magnet are individually attachable to and detachable from said treatment container from above said treatment container.

7. The substrate treatment apparatus as set forth in claim 6, further comprising:
   a coil holder for holding said annular electromagnetic coil attached thereto,
   wherein said multiblade centrifugal fan further comprises a support body for rotatably supporting said fan main body on an inner periphery side of said treatment container via a thrust bearing, and
   wherein said coil holder, said thrust bearing, and said support body are individually attachable to and detachable from said treatment container from above said treatment container.

* * * * *